US012725761B2

(12) United States Patent
Ramaswamy et al.

(10) Patent No.: US 12,725,761 B2
(45) Date of Patent: Sep. 1, 2026

(54) REMOTE PLASMA SOURCE

(71) Applicant: Applied Materials, Inc., Santa Clara, CA (US)

(72) Inventors: Kartik Ramaswamy, San Jose, CA (US); Mehran Moalem, Fremont, CA (US); Farhad Moghadam, Saratoga, CA (US); Eller Y. Juco, San Leandro, CA (US)

(73) Assignee: Applied Materials, Inc., Santa Clara, CA (US)

( * ) Notice: Subject to any disclaimer, the term of this patent is extended or adjusted under 35 U.S.C. 154(b) by 71 days.

(21) Appl. No.: 18/896,265

(22) Filed: Sep. 25, 2024

(65) Prior Publication Data

US 2025/0118538 A1 Apr. 10, 2025

Related U.S. Application Data

(60) Provisional application No. 63/542,752, filed on Oct. 5, 2023.

(51) Int. Cl.
*H01J 37/32* (2006.01)

(52) U.S. Cl.
CPC ..... *H01J 37/32357* (2013.01); *H01J 37/3211* (2013.01); *H01J 37/32183* (2013.01); *H01J 2237/002* (2013.01)

(58) Field of Classification Search
CPC ............. H01J 37/32009; H01J 37/3244; H01J 37/32082; H01J 37/32541; H01J 37/32357; H01J 37/32449; H01J 37/32348; H01J 37/32532; H01J 37/32568; H01J 37/32724; H01J 2237/332; H01J 37/32091; H01J 37/32192; H01J 37/32366; H01J 37/32376; H01J 37/32752; H01J 37/32825; H01J 37/32559; H01J 37/32899; H01J 2201/30469; H01J 2237/0206; H01J 2237/162; H01J 2237/3151; H01J 2237/335; H01J 37/321; H01J 37/32174;

(Continued)

(56) References Cited

U.S. PATENT DOCUMENTS

2012/0199558 A1* 8/2012 Faulkner ................ H01H 33/16
218/143
2014/0346952 A1* 11/2014 Choi ........................ H05H 1/46
315/111.21

(Continued)

FOREIGN PATENT DOCUMENTS

JP 2022072152 A 5/2022
KR 20180002209 A 1/2018

OTHER PUBLICATIONS

International Search Report and Written Opinion for International Application No. PCT/US2024/048397 dated Dec. 30, 2024.

*Primary Examiner* — Monica C King
(74) *Attorney, Agent, or Firm* — Patterson + Sheridan, LLP

(57) ABSTRACT

Some embodiments are directed to a remote plasma system. The remote plasma system may include: a first tube; a second tube; a first isolation component coupled between a first end of the first tube and a first end of the second tube; a second isolation component coupled between a second end of the first tube and a second end of the second tube; and a first capacitive element coupled to the first isolation component.

20 Claims, 4 Drawing Sheets

(58) Field of Classification Search
CPC ........... H01J 37/32256; H01J 37/32467; H01J 37/32522; H01J 37/32596; H01J 37/32642; H01J 37/32779; H01J 37/32807; H01J 37/32935; H01J 37/32; H01J 37/32183; H01J 37/32715; H01J 37/32834
See application file for complete search history.

(56) References Cited

U.S. PATENT DOCUMENTS

2016/0307739 A1 10/2016 Lee et al.
2022/0415612 A1 12/2022 Moalem et al.

* cited by examiner

REMOTE PLASMA SOURCE

CROSS-REFERENCE TO RELATED APPLICATION

The present application for patent claims the benefit of priority to U.S. Provisional Patent Appl. No. 63/542,752, filed Oct. 5, 2023, which is hereby incorporated by reference herein in its entirety.

BACKGROUND

Field

Embodiments of the present invention generally relate to a system and methods used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma assisted etching process, such as a reactive ion etch (RIE) plasma process, to form high aspect ratio openings in a material layer, such as a dielectric layer, of a substrate. In a typical RIE plasma process, a plasma is formed in a processing chamber and ions from the plasma are accelerated towards a surface of a substrate to form openings in a material layer disposed beneath a mask layer formed on the surface of the substrate.

Plasma-enhanced chemical vapor deposition and etching processes are processes where electromagnetic energy is applied to at least a gas or vapor to transform the gas into a reactive plasma. Forming a plasma can lower the temperature required to form or etch a film or increase the rate of layer formation or etching. A plasma may be generated inside the processing chamber, i.e., in situ, or in a remote plasma generator that is remotely positioned from the processing chamber. Remote plasma generators offer several advantages. For example, the remote plasma generator provides a plasma capability to a deposition or etching system that minimizes the plasma interaction with the substrate and chamber components, thereby preventing damage to the substrate and the interior of the processing chamber.

However, conventional plasma processing systems will include multiple radio frequency (RF) sources to generate and control the generation of a plasma in different parts of a processing chamber during different portions of a plasma processing sequence performed in a plasma processing chamber. For example, a plasma processing chamber may include at least one RF source that is used to form an in-situ plasma within the processing region of a plasma processing chamber to deposit a film or etch a layer formed on a substrate, and one or more remote plasma generators that is in communication with the processing region of the process chamber and is used perform a cleaning process that provides a radical containing cleaning gas to the processing region of the plasma processing chamber after the substrate has been processed in the plasma processing chamber. The use of separate RF sources to generate a plasma within different portions of the processing chamber and at different times can be expensive due to the high cost of the RF delivery components required to separately generate the plasmas.

Remote plasma generators generally have a protective anodized aluminum coating to protect the aluminum interior walls from degradation. However, anodized aluminum coatings are usually porous and prone to surface reactions. Therefore, the lifetime of anodized aluminum coatings is limited due to the degradation of the anodized coating in the plasma cleaning environment. Failure of the protective anodized coating over an aluminum surface leads to excessive particulate generation within the downstream reactor chamber. In addition, the downstream reactor chamber also suffers unstable plasma performance due to change in surface condition of the protective anodized coating as the process continues. Therefore, the wafer deposition/etch rates, film uniformity and plasma coupling efficiency from wafer to wafer are degraded. Moreover, the remote plasma generators are typically formed as a complete system that do not contain replaceable components, and thus need to be swapped out after their lifetime has been reached, which is often wasteful and expensive.

Therefore, there is a need for an apparatus and method for processing a substrate in a plasma processing system that solves the problems described above.

SUMMARY

Embodiments provided herein generally include apparatus, remote plasma systems and methods for generating a plasma.

Some embodiments are directed to a remote plasma system. The remote plasma system may include: a first tube; a second tube; a first isolation component coupled between a first end of the first tube and a first end of the second tube; a second isolation component coupled between a second end of the first tube and a second end of the second tube; and a first capacitive element coupled to the first isolation component.

Some embodiments are directed to a method for remote plasma generation. The method generally includes: electrically isolating a first tube from a second tube, wherein a first capacitive element is coupled between the first tube and the second tube; providing an excitation signal to an excitation coil; and generating a plasma within the first tube and the second tube based on the excitation signal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure generally relate to a system used in a semiconductor device manufacturing process. More specifically, embodiments provided herein generally include a remote plasma source (RPS), or sometimes referred to herein as a remote plasma generator. In some applications, the RPS may be used to clean portions of a semiconductor manufacturing chamber.

Plasma Processing System Examples

Figure 1:
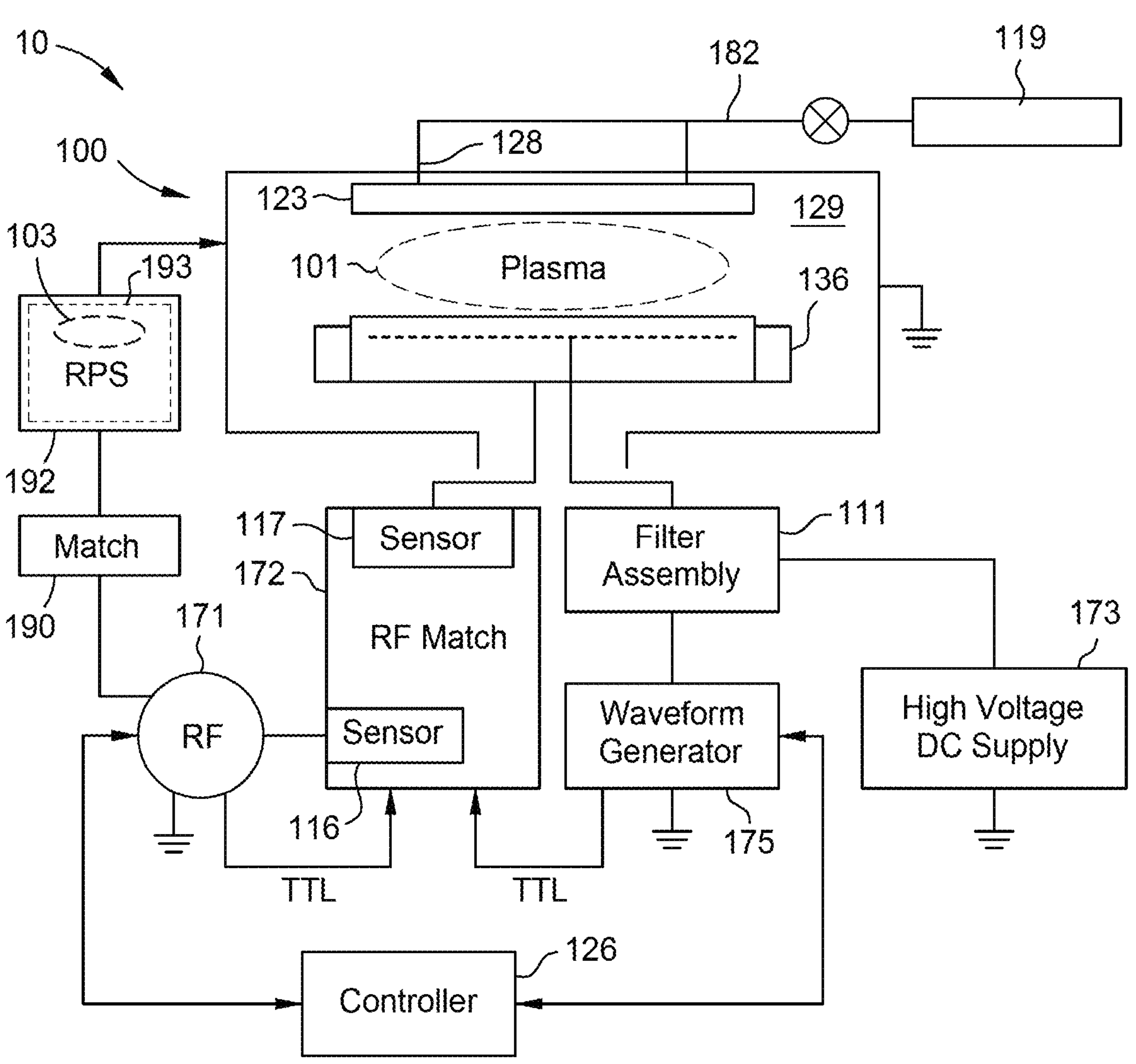
FIG. 1 is a schematic representation of a plasma processing system.

FIG. 1 is a schematic representation of a plasma processing system. The plasma processing system 10 is configured for plasma-assisted etching processes, such as a reactive ion etch (RIE) plasma processing. The plasma processing system 10 can also be used in other plasma-assisted processes, such as plasma-enhanced deposition processes (for example, plasma-enhanced chemical vapor deposition (PECVD) processes, plasma-enhanced physical vapor deposition (PEPVD) processes, plasma chamber clean processing, plasma-enhanced atomic layer deposition (PEALD) processes, plasma treatment processing, plasma-based ion implant processing, or plasma doping (PLAD) processing. In one configuration, as shown in FIG. 1A, the plasma processing system 10 is configured to form a capacitive coupled plasma (CPP). However, in some embodiments, a plasma may alternately be generated by an inductively coupled source disposed over a processing region of the plasma processing system 10.

The plasma processing system 10 includes a processing chamber 100, a substrate support assembly 136, a gas delivery system 182, a high DC voltage supply 173, a radio frequency (RF) generator 171, and an RF match 172 (e.g., RF impedance matching network). A chamber lid 123 includes one or more sidewalls and a chamber base that are configured to withstand the pressures and energy applied to them while a plasma 101 is generated within a vacuum environment maintained in a processing volume 129 of the processing chamber 100 during processing.

The gas delivery system 182, which is coupled to the processing volume 129 of the processing chamber 100 is configured to deliver at least one processing gas from at least one gas processing source 119 to the processing volume 129 of the processing chamber 100. The gas delivery system 182 includes the processing gas source 119 and one or more gas inlets 128 positioned through the chamber lid 123. The gas inlets 128 are configured to deliver one or more processing gasses to the processing volume 129 of the processing chamber 100. The processing gas source 119 is also coupled to an inlet port of the remote plasma source (RPS) 192 so that a process gas can be provided through the RPS 192 to transform the gas into a reactive plasma and then to the processing region of the process chamber 100.

The processing chamber 100 includes an upper electrode (e.g., the chamber lid 123) and a lower electrode (e.g., the substrate support assembly 136) positioned in the processing volume 129 of the processing chamber 100. The upper and lower electrodes face one another. In one embodiment, the RF generator 171 is electrically coupled to the lower electrode. The RF generator 171 is configured to deliver an RF signal to ignite and maintain the plasma 101 between the upper and lower electrodes. In some alternative configurations, the RF generator 171 can also be electrically coupled to the upper electrode. For example, the RF generator 171 may deliver an RF source power to an RF baseplate within a cathode assembly (e.g., in the substrate support assembly 136) for plasma production, whereas the upper electrode is grounded. A center frequency of the RF source power can be from 13.56 MHz to very high frequency band such as 40 MHz, 60 MHz, 120 MHz or 162 MHz. In some examples, the RF source power can also be delivered through the upper electrode. The RF source power can be operated in a continuous mode or a pulsed mode. A pulsing frequency of the RF power can be from 100 to 10 kHz, and duty cycles are ranging from 5% to 95%. The RF generator 171 has a frequency tuning capability and can adjust its RF power frequency within e.g., ±5% or ±10%. In some embodiments, the RF generator 171 switches the RF power frequency at a predefined speed (e.g., two nanoseconds, fifty nanoseconds, etc.).

The substrate support assembly 136 may be coupled to a high voltage DC supply 173 that supplies a chucking voltage thereto. The high voltage DC supply 173 may be coupled to a filter assembly 178 that is disposed between the high DC voltage supply 173 and the substrate support assembly 136.

The filter assembly 178 is configured to electronically isolate the high voltage DC supply 173 during plasma processing. In one configuration, a static DC voltage is between about −5000V and about 5000V, and is delivered using an electrical conductor (such as a coaxial power delivery line). The filter assembly 178 may include multiple filtering components or a single common filter.

The substrate support assembly 136 is coupled to a pulsed voltage (PV) waveform generator 175 configured to supply a PV to bias the substrate support assembly 136 through a filter assembly 111. The PV waveform generator 175 is coupled to the filter assembly 178. The filter assembly 178 is disposed between the PV waveform generator 175 and the substrate support assembly 136. The filter assembly 178 is configured to electronically isolate the PV waveform generator 175 during plasma processing.

The substrate support assembly 136 is coupled to the RF generator 171 configured to deliver an RF signal to the processing volume 129 of the processing chamber 100. The RF generator 171 is electronically coupled to the RF match 172 disposed between the RF generator 171 and the processing volume 129 of the processing chamber 100. For example, the RF match 172 is an electrical circuit used between the RF generator 171 and a plasma reactor (e.g., the processing volume 129 of the processing chamber 100) to optimize power delivery efficiency. One or more RF filters (e.g., within the RF match 172) are designed to only allow powers in a selected frequency range, and to isolate RF power supplies from each other. In some cases, a bandwidth of an RF filter has to be larger than a frequency tuning range of the RF generator 171.

During the plasma processing, the RF generator 171 delivers an RF signal to the substrate support assembly 136 via the RF match 172. For example, the RF signal is applied to a load (e.g., gas) in the processing volume 129 of the processing chamber 100. If an impedance of the load is not properly matched to an impedance of a source (e.g., the RF generator 171), a portion of a waveform can reflect back in an opposite direction. Accordingly, to prevent a substantial portion of the waveform from reflecting back, some implementations find a match impedance (e.g., a matching point) by adjusting one or more components of the RF match 172 as the source and load impedances change.

The RF match 172 is electrically coupled to the RF generator 171, the substrate support assembly 136, and the PV waveform generator 175. The RF match 172 is configured to receive a synchronization signal from either or both of the RF generator 171 and the PV waveform generator 175.

The RF generator 171 and the PV waveform generator 175 are each directly coupled to a system controller 126. The system controller 126 synchronizes the respective generated RF signal and PV waveform.

Voltage and current sensors can be placed at an input and/or output of the RF match 172 to measure impedance and other parameters. These sensors can be synchronized using an external transistor-transistor logic (TTL) synchronization signal from an advanced waveform generator and/or RF generators or using measured voltage and current data to determine timing internally. For example, an output sensor 117 is configured to measure the impedance of the plasma processing chamber 100, and other characteristics such as the voltage, current, harmonics, phase, and/or the like. An input sensor 116 is configured to measure the impedance of the RF generator 171 and other characteristics such as the voltage, current, harmonics, phase, and/or the like. Based on either of the synchronization signals or the characteristics of the plasma processing chamber 100, the RF match 172 is able to capture fast impedance changes and optimize impedance matching.

The PV waveform generator 175 is used to supply a PV waveform and/or a tailored voltage waveform, which is a sum of harmonic frequencies associated with the waveform. The PV waveform generator 175 may output a synchronization TTL signal to the RF match 172. The voltage waveform is coupled to a bias electrode through the filter assembly 178. The high DC voltage supply 173 is applied to chuck a substrate during a process for a thermal control. In some cases, there can be a third electrode at an edge of the cathode assembly for edge uniformity control.

As shown, the plasma processing system may include a remote plasma source (RPS) 192, which may be used to clean the chamber after one or more deposition processes. In some aspects, the RPS 192 may be driven by the same RF generator 171 used for substrate processing, although a separate generator may be used. A match 190 may be coupled between the generator 171 and the RPS 192 to reduce reflections and increase power efficiency. The match 190 may be a fixed match, in some cases, although a variable match may be used in some applications. In some aspects, frequency tuning may be used to perform matching. In some aspects, an arrangement may be used where power from generator 171 is split so both RPS plasma 103 and in-chamber plasma 101 are enabled with part of the power going to the RPS 192 and part going to the processing chamber.

Example Remote Plasma Source

Certain aspects of the present disclosure are directed towards a remote plasma source (RPS), such as the RPS 192 described with respect to FIG. 1. The plasma source described herein may be modulator with field replaceable parts. The plasma source may be customizable to a generator frequency, as described in more detail herein. The plasma source may not use any ferrites, as opposed to conventional RPS implementations that include ferrite cores, reducing complexity, costs, size, and power losses. The RPS described herein may be easier to clean and maintain than conventional implementations and allows for the opportunity to use coatings to prevent components within a process gas from attacking the internal passages within the RPS, such as a coating that provides resistance to corrosion by fluorine.

The RPS disclosed herein may allow for usage of a power supply (e.g., generator 171) to generate a plasma 103 within the RPS 192 during a first period of time and form a plasma 101 within the processing volume 129 during a deposition or etching process performed on a substrate disposed on the substrate support assembly 136 during a second period of time. For example, RPS may be operable with a generator operating at a higher frequency (e.g., 13.56 MHz) and with lower power (e.g., 3.5 kW) than conventional RPSs.

Figure 2:
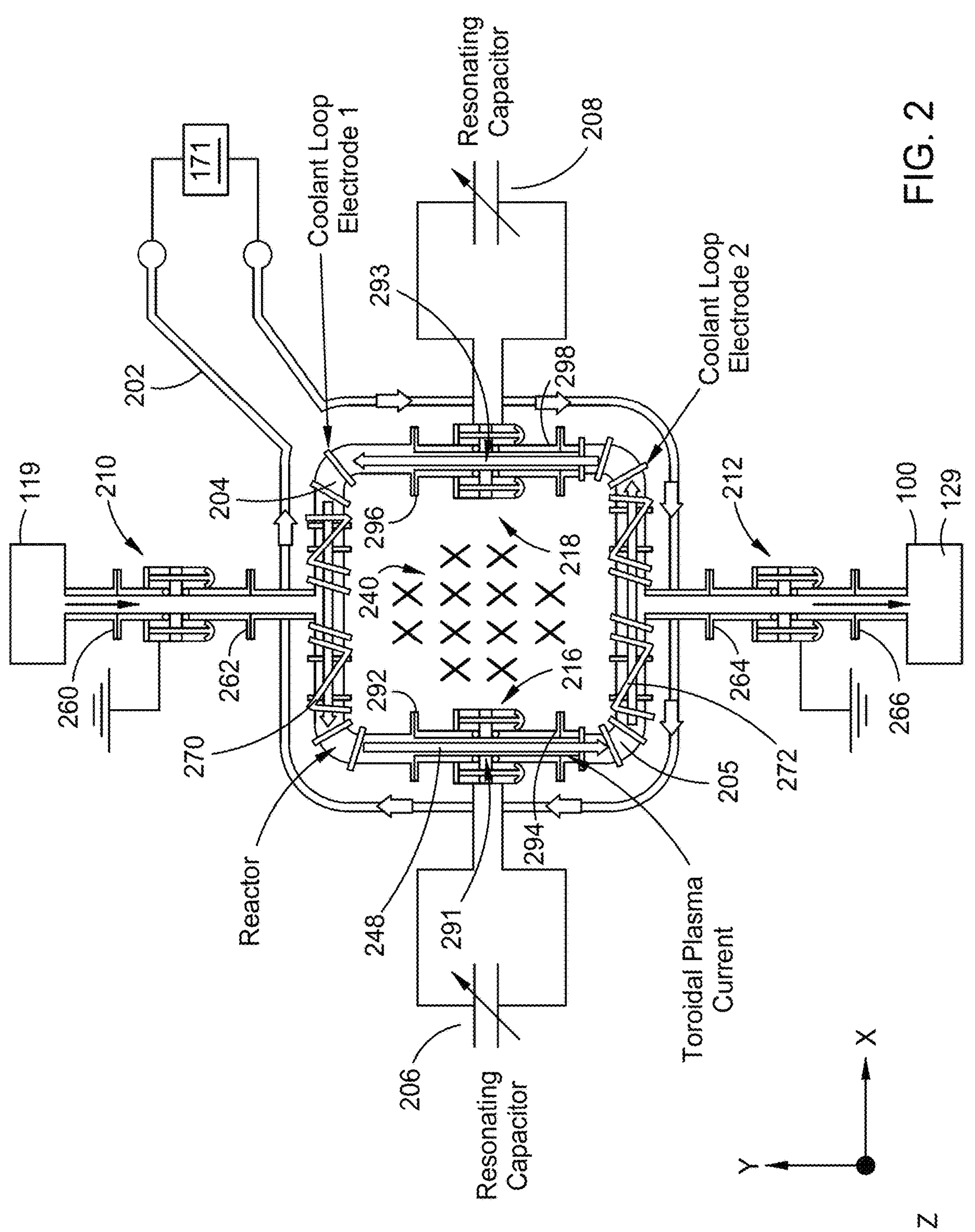
FIG. 2 illustrates a remote plasma source (RPS), in accordance with certain aspects of the present disclosure.

FIG. 2 illustrates a remote plasma source (RPS) 200 (e.g., associated with RPS 192), in accordance with certain aspects of the present disclosure. As shown, the source 200 may include a primary excitation coil 202 and a reactor including a first plasma tube 204 and a second plasma tube 205. In some embodiments, the first plasma tube 204 and second plasma tube 205 include a material such as stainless steel (SST) or aluminum with any suitable coating such as magnesium. The primary excitation coil 202 may be driven with a 13.56 MHz radio frequency (RF) signal (e.g., RF generator 171) causing an oscillating B field 240. Plasma 248 may be generated in the plasma tubes 204 and 205 from the action of the B field. As illustrated in FIG. 2, the primary excitation coil 202 is wound in a parallel relationship to the orientation of the first plasma tube 204 and second plasma tube 205, such that at least a portion of the generated oscillating B field 240 will pass through the center of the plasma containing loop formed by the first plasma tube 204 and second plasma tube 205. The primary excitation coil 202 may be disposed along the plasma tubes 204, 205 (also referred to as "vacuum tubes"). In other words, in some embodiments, a first direction (Z-direction) around which the winding(s) of the primary excitation coil 202 are wound is perpendicular to a first plane (X-Y plane) along which the first plasma tube 204 and second plasma tube 205 extend. In some aspects, the primary excitation coil may be outside the loop formed by tubes 204 and 205 (as shown in FIG. 2), but in other aspects, the coil may be on the inside, or lay next to loop. The coil 202 acts as a primary coil and the plasma generated in the tube 204 may act as a secondary coil magnetically coupled to the primary coil.

As shown, direct-current (DC) breaks 216, 218 (e.g., insulators) may be placed between the plasma tubes 204, 205, serving to electrically isolate the plasma tubes 204, 205 from each other. As an example, each DC break may include two flanges (e.g., flanges 292, 294 for DC break 216 and flanges 296, 298 for DC break 218) with a ceramic material containing section that separates the flanges (e.g., flanges 292, 294, or flanges 296, 298), allowing a high voltage to be generated across the DC blocks during the generation of the plasma 248. For example, flange 292 of DC break 216 may be coupled to a first end of the tube 204 and flange 294 of DC break 216 may be coupled to a first end of the tube 205. Flange 296 of DC break 218 may be coupled to a second end of the tube 204 and flange 298 of DC break 218 may be coupled to a second end of the tube 205. The DC breaks 216, 218 are each configured to allow a vacuum to be generated and maintained within a central plasma generating region (e.g., regions 291, 293 shown in FIG. 2), which extends between first and second ends of the DC beaks 216, 218. The central plasma generating region within each of the DC beaks 216, 218 include a tubular shaped opening that is in fluid communication within the internal region of plasma tubes 204, 205 to form a continuous open loop in which the plasma 248 is formed during plasma processing. The tubular plasma tube may have circular, rectangular, or other suitable cross section. As noted above, in some embodiments, the excitation coil 202 includes a coil wire that is wound in a loop shape that is substantially parallel to a first plane, and the first plasma tube 204, second plasma tube 205, first DC break 216, and second DC break 218 are formed in a tubular loop that extends in a direction that is parallel to the first plane.

The RPS 200 includes an isolated resonating structure within the formed plasma vessel, which includes the plasma tubes 204, 205 and the DC beaks 216, 218. The isolated resonating structure formed within the RPS 200 utilizes the plasma formed within the plasma vessel as an inductor. In some embodiments, the RPS 200 includes one or more impedance producing elements that are coupled in parallel with the DC breaks 216, 218. For example, resonating capacitive elements 206, 208 may be coupled in parallel with the DC breaks 216, 218, respectively. The hollow inductor (e.g., plasma in a tube) and externally attached capacitor form a resonating structure. That is, the capacitive elements 206, 208 form a resonance circuit to ignite the plasma inside the tube 204 during plasma processing. While two capacitive elements 206, 208 are shown in FIG. 2, a configuration with only one capacitive element, which is in parallel with one of DC breaks 216, 218, may be used in some cases.

In some embodiments, as shown in FIG. 2, one or more electrically-isolated coolant loops, such as coolant loops 270, 272, may be disposed around the tube 204 to control the temperature of the plasma tubes 204, 205 and the DC beaks 216, 218 during processing. The one or more coolant loops may include a liquid coolant type of heat exchanging device to remove the excess heat and control the temperature of the RPS 200 components.

Figure 3:
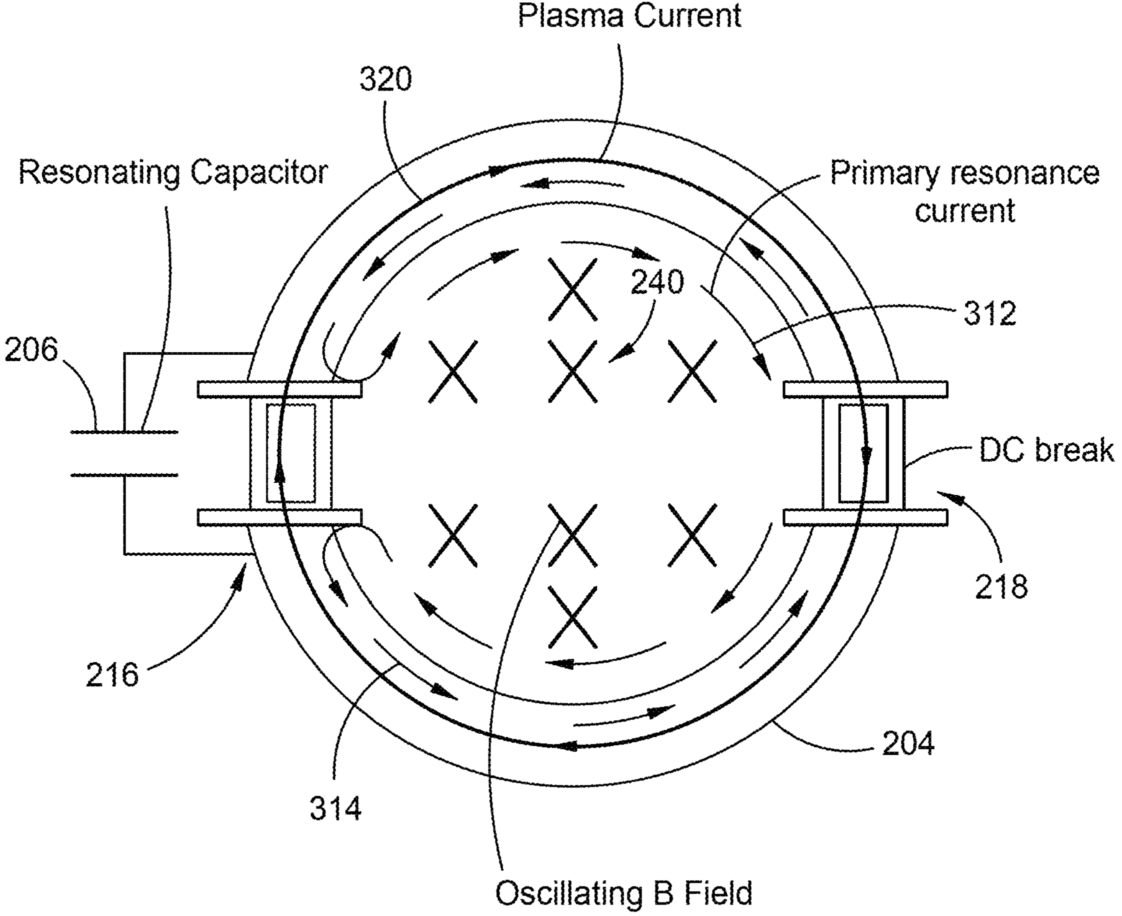
FIG. 3 illustrates currents formed in the reactor, in accordance with certain aspects of the present disclosure.

FIG. 3 illustrates currents formed in a portion of the RPS, in accordance with certain aspects of the present disclosure. As shown in FIG. 3, the RPS includes a resonant circuit, which includes a capacitive element 206, which is coupled across the DC break 216. Based on the current formed in the primary excitation coil 202, primary resonance currents 312, 314 are generated on the tube 204. As shown, due the DC breaks 216, 218, the currents 312, 314 flow between the DC breaks 216, 218 to ignite the plasma. The DC breaks in the hollow inductor plasma vessel allow the B fields 240 to suffuse the central plasma generating regions formed therein. The high voltage generated across the DC breaks due to the RF power provided to the primary excitation coil 202 and the presence of the resonant circuit(s) coupled to the DC breaks 216, 218 can be used to ignite the plasma without ignition circuits. Use of two or more DC breaks reduces the voltage drop across the break, reducing any issues with sputtering of portions of the plasma tubes 204, 205 and the DC beaks 216, 218. Once plasma is ignited, plasma current 320 (e.g., a toroidal plasma current) flows in the plasma tubes 204, 205 and the DC beaks 216, 218, as shown. The plasma current may be in the direction of an azimuthal electric field (e.g., parallel to the X-Y plane). That is, the oscillating B field generates an oscillating azimuthal electric field. The electric field can close in on itself allowing the plasma current to flow continuously once the plasma has been ignited.

As shown, the capacitive elements 206, 208 of the resonant circuit may be tunable (e.g., such as using variable capacitive elements). Depending on the frequency of the generator (e.g., generator 171) used to drive the primary excitation coil 202, the resonating structure may be tuned (e.g., to set the resonance frequency by adjusting capacitance of capacitive elements 206, 208) or changing the frequency of the generator or both.

Referring back to FIG. 2, the tube 204 may include an inflow portion (e.g., for inflow of gas) and the tube 205 may include an outflow portion (e.g., for outflow of gas). A DC break 210 may be coupled to the inflow portion of tube 204 and a DC break 212 may be coupled to the outflow portion of tube 205. The flange 260 of the DC break 210 may be coupled to a gas delivery connection port (not shown) of a gas delivery source 119 (FIG. 2) coupled to the RPS and the flange 262 of the DC break 210 may be coupled to the inflow portion of the tube 204. The flange 260 of the DC break 210 may be grounded and isolated from the inflow portion of the tube 204 by the ceramic material containing section that separates the flanges. Similarly, the flange 266 of the DC break 212 may be coupled to an inlet port (not shown) formed within a wall of the plasma processing chamber (e.g., chamber 100 in FIG. 1) to which the RPS is coupled, and the flange 462 of the DC break 212 may be coupled to the outflow portion of the tube 205. Thus, the flange 266 of the DC break 212 may be grounded and isolated from the outflow portion of the tube 205 by the ceramic material containing section that separates the flanges in the DC break.

Certain aspects of the present disclosure leverage the use of existing RF generators (e.g., RF generator 171 of FIG. 1) to power a remote plasma source. In other words, the RF generator 171 may be used to generate the plasma 101 of the chamber 100 for substrate processing at one point in time, and also used to power the RPS at another point in time. In some aspects, at another point in time, the generator may simultaneously be used to power the RPS and substrate processing sections using an RF-power-split circuit.

Although the RPS described herein may be implemented without a ferrite core, in some aspects, a ferrite core suitable for high frequency (e.g., 13.56 MHz) may be used to facilitate coupling of power to the plasma, or reducing the voltage for ignition. For example, as shown in FIG. 1, the RPS 192 may include a ferrite core 193. The ferrite core may enclose both the excitation coil and the plasma tube.

In some aspects, the conductive walls of the plasma tube may be used as an excitation coil (e.g., instead having a separate excitation coil 202). For instance, instead of using the coil 202, power (e.g., 13.56 MHz power) may be directly provided to the tubes 204 and 205 or to the two flanges of the DC break.

Figure 4:
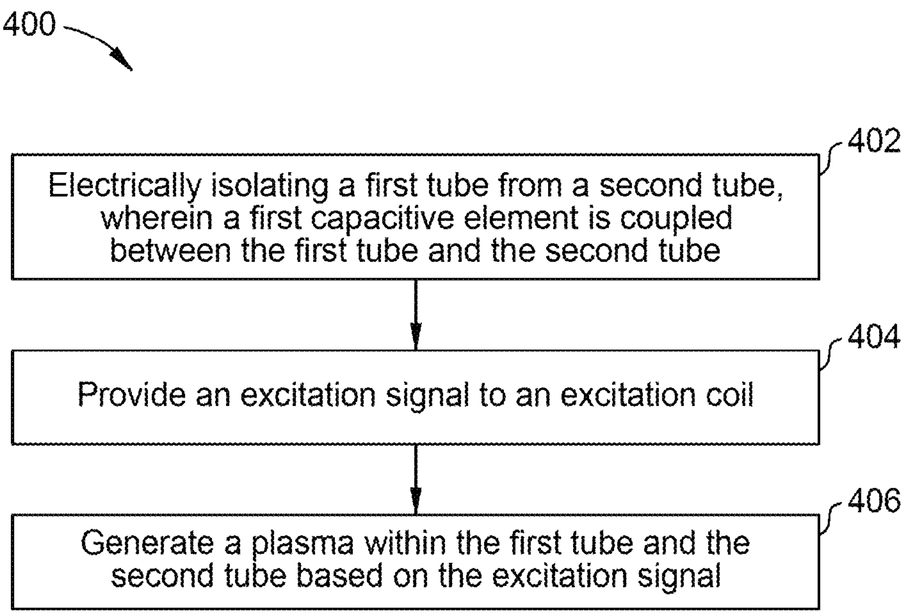
FIG. 4 is a process flow diagram illustrating a method for remote plasma generation, in accordance with certain embodiments of the present disclosure.

FIG. 4 is a process flow diagram illustrating a method 400 for remote plasma generation, in accordance with certain embodiments of the present disclosure. The method 400 can be performed by a remote plasma system, such as the RPS 200.

At operations 402, the remote plasma system includes DC breaks that electrically isolates a first tube (e.g., plasma tube 204) from a second tube (e.g., plasma tube 205), and together form a plasma vessel that forms a loop into which a plasma can be formed during processing. An impedance producing element, such as a first capacitive element (e.g., capacitive element 206) may be coupled across a DC break disposed between a portion of the first tube and the second tube to form a resonant circuit.

At operations 404, the remote plasma system provides an excitation signal to an excitation coil (e.g., excitation coil 202) or to the first tube and the second tube. In some embodiments, the excitation signal includes an RF signal, such as an RF signal provided at a frequency greater than 1 MHz, such as 13.56 MHz.

At operations 406, the remote plasma system generates a plasma (e.g., plasma current 320) within the DC breaks, first tube and the second tube based on the excitation signal and the impedance value (e.g., impedance setting) of the impedance producing element of the resonant circuit. The impedance value of the resonant circuit being configured to cause the resonant circuit to be substantially at or near resonance at the excitation signal frequency. In some aspects, a resonating signal is generated via the first capacitive element based on the excitation signal to generate the plasma in the first tube and the second tube.

In some aspects of the RPS design disclosed herein, the first tube and the second tube are isolated via a first DC break (e.g., DC break 216) and a second DC break (e.g., DC break 218). The first DC break may include a first flange (e.g., flange 292) coupled to the first end of the first tube and a second flange (e.g., flange 294) coupled to the first end of the second tube. The second DC break (e.g., DC break 218) may include a first flange (e.g., flange 296) coupled to a second end of the first tube and a second flange (e.g., flange 298) coupled to a second end of the second tube. The first capacitive element may include a first terminal coupled to the first flange of the first DC break and a second terminal coupled to a second flange of the first DC break. In some aspects, a first terminal of a second capacitive element (e.g., capacitive element 208) may be coupled to the first flange of the second DC break and a second terminal of the second capacitive element may be coupled to a second flange of the second DC break.

In some aspects of the RPS design disclosed herein, the remote plasma system may electrically isolate an inflow portion of the first tube and an outflow portion of the second tube from a housing. The inflow portion of the first tube may be isolated from the housing via a third DC break (e.g., DC break 210) and the outflow portion of the second tube is isolated from the housing via a fourth DC break (e.g., DC break 212). The third DC break may include a first flange (e.g., flange 262) coupled to an inflow portion of the first tube and a second flange (e.g., flange 260) coupled to the housing. The fourth DC break may include a first flange (e.g. flange 264) coupled to an outflow portion of the second tube and a second flange (e.g., flange 266) coupled to the housing for the remote plasma source. The second flange of the third DC break and the second flange of the fourth DC break may be coupled to a ground potential node. In some aspects, the remote plasma system may cool the first tube via a first coolant loop (e.g., coolant loop 270) cool the second tube via a second coolant loop (e.g., coolant loop 272).

While the foregoing is directed to embodiments of the present disclosure, other and further embodiments of the disclosure may be devised without departing from the basic scope thereof, and the scope thereof is determined by the claims that follow.

What is claimed is:

1. A remote plasma system, comprising:

a first tube;

a second tube;

a first isolation component coupled between a first end of the first tube and a first end of the second tube; and a second isolation component coupled between a second end of the first tube and a second end of the second tube; wherein a first terminal of a first capacitive element is coupled to the first end of the first tube and a second terminal of the first capacitive element is coupled to the first end of second tube.

2. The remote plasma system of claim 1, wherein:

the first isolation component comprises a first direct-current (DC) break having a first flange coupled to the first end of the first tube and a second flange coupled to the first end of the second tube; and the second isolation component comprises a second DC break having a first flange coupled to a second end of the first tube and a second flange coupled to a second end of the second tube.

3. The remote plasma system of claim 2, further comprising an excitation coil, wherein the first tube, the second tube, the first isolation component, and the second isolation component form a loop that extends across a first plane, and the excitation coil comprises a coil wire that is wound in a loop that is parallel to the first plane.

4. The remote plasma system of claim 3, further comprising a second capacitive element having a first terminal coupled to the first flange of the second DC break and a second terminal coupled to a second flange of the second DC break.

5. The remote plasma system of claim 1, further comprising a third DC break having a first flange coupled to an inflow portion of the first tube and a second flange coupled to a housing.

6. The remote plasma system of claim 5, further comprising a fourth DC break having a first flange coupled to an outflow portion of the second tube and a second flange coupled to the housing.

7. The remote plasma system of claim 6, wherein the second flange of the third DC break and the second flange of the fourth DC break are coupled to a ground potential node.

8. The remote plasma system of claim 1, further comprising:

a first coolant loop disposed around the first tube; and a second coolant loop disposed around the second tube.

9. The remote plasma system of claim 1, further comprising:

an excitation coil; and a generator configured to generate a radio frequency (RF) signal provided to the excitation coil to generate a plasma within the first tube and the second tube, wherein the first capacitive element is configured to generate a resonating signal based on the RF signal to generate the plasma in the first tube and the second tube.

10. The remote plasma system of claim 9, further comprising a match coupled between the generator and a remote plasma source including the first tube and the second tube.

11. The remote plasma system of claim 1, further comprising a ferrite core at least partially surrounding the first tube and the second tube.

12. A method for remote plasma generation, comprising:

electrically isolating a first tube from a second tube, wherein a first capacitive element is coupled between the first tube and the second tube; and providing an excitation signal to an excitation coil or to the first tube and the second tube; and generating a plasma within the first tube and the second tube based on the excitation signal, wherein a resonating signal is generated via the first capacitive element based on the excitation signal, and is configured to generate the plasma within the first tube and the second tube.

13. The method of claim 12, wherein:

the first tube and the second tube are isolated via a first direct-current (DC) break and a second DC break;

the first DC break comprises a first flange coupled to a first end of the first tube and a second flange coupled to a first end of the second tube; and the second DC break comprises a first flange coupled to a second end of the first tube and a second flange coupled to a second end of the second tube.

14. The method of claim 13, wherein the first capacitive element comprises a first terminal coupled to the first flange of the first DC break and a second terminal coupled to a second flange of the first DC break.

15. The method of claim 14, wherein a first terminal of a second capacitive element is coupled to the first flange of the second DC break and a second terminal of the second capacitive element is coupled to a second flange of the second DC break.

16. The method of claim 12, further comprising electrically isolating an inflow portion of the first tube and an outflow portion of the second tube from a housing.

17. The method of claim 16, wherein:

the inflow portion of the first tube is isolated from the housing via a third DC break; and the outflow portion of the second tube is isolated from the housing via a fourth DC break.

18. The method of claim 17, wherein:

the third DC break comprises a first flange coupled to the inflow portion of the first tube and a second flange coupled to the housing; and the fourth DC break comprises a first flange coupled to the outflow portion of the second tube and a second flange coupled to the housing.

19. The method of claim 18, wherein the second flange of the third DC break and the second flange of the fourth DC break are coupled to a ground potential node.

20. The method of claim 12, further comprising:

cooling the first tube via a first coolant loop; and cooling the second tube via a second coolant loop.

* * * * *